United States Patent
Schmitz et al.

(10) Patent No.: US 6,303,453 B1
(45) Date of Patent: Oct. 16, 2001

(54) METHOD OF MANUFACTURING A SEMICONDUCTOR DEVICE COMPRISING A MOS TRANSISTOR

(75) Inventors: Jurriaan Schmitz; Pierre H. Woerlee, both of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/329,030

(22) Filed: Jun. 9, 1999

(30) Foreign Application Priority Data

Jun. 11, 1998 (EP) .................................... 98201958

(51) Int. Cl.[7] .................................. H01L 21/336
(52) U.S. Cl. ..................... 438/305; 438/563; 438/301
(58) Field of Search .................................. 438/305, 299, 438/301, 303, 306, 307, 558, 563

(56) References Cited

U.S. PATENT DOCUMENTS

| | | | | |
|---|---|---|---|---|
| 5,457,060 | * | 10/1995 | Chang ................................... | 438/228 |
| 5,518,945 | * | 5/1996 | Bracchitta et al. ................... | 438/307 |
| 5,702,986 | | 12/1997 | Mathews et al. .................... | 438/163 |
| 5,759,885 | * | 6/1998 | Son ....................................... | 438/305 |
| 5,998,272 | * | 12/1999 | Ishida et al. ......................... | 438/305 |
| 6,087,234 | * | 7/2000 | Wu ....................................... | 438/299 |

* cited by examiner

*Primary Examiner*—Michael Trinh
(74) *Attorney, Agent, or Firm*—Steven R. Biren

(57) ABSTRACT

The invention relates to a method of manufacturing a (horizontal) MOST, as used, for example, in (BI)CMOS ICs. On either side of a gate electrode (2), the surface of a silicon substrate (10, 11) which is positioned above a gate oxide (IA) is provided with a dielectric layer (1B) at the location where a source (3) and drain (4) are to be formed, which dielectric layer includes a thermal oxide layer (1B) to be formed as the starting layer. The source (3) and/or drain (4) is/are provided with LDD regions (3A, 4A) and the remaining parts (3B, 4B) of the source (3) and drain (4) are provided by an ion implantation ($I_1$) of doping atoms into the silicon substrate (10, 11). A MOST obtained in this way still suffers from so-called short-channel effects, resulting in a substantial dependence of the threshold voltage upon the length of the gate electrode (2), in particular in the case of very short lengths of the gate electrode (2). In a method according to the invention, the LDD regions (3A, 4A) are made as follows: in a first step, suitable doping atoms (D) are implanted into the dielectric layer (1B), in a second ion implantation ($I_2$), and subsequently in a second step, a part of the doping atoms (D) is diffused from the dielectric layer (1B) into the silicon substrate (10, 11), whereby the LDD regions (3A, 4A) are formed. This method enables a MOST with excellent properties to be obtained, for example with a flatter profile of the threshold voltage versus the gate-electrode (2) length (curve 130) than in conventionally made MOSTs (curve 131). This result is obtained in a simple and reproducible manner.

9 Claims, 4 Drawing Sheets

METHOD OF MANUFACTURING A SEMICONDUCTOR DEVICE COMPRISING A MOS TRANSISTOR

BACKGROUND OF THE INVENTION

The invention relates to a method of manufacturing a semiconductor device comprising a MOS transistor, for brevity hereinafter generally referred to as MOST (=Metal Oxide Semiconductor Transistor), in which method a gate oxide and a gate electrode are formed on a surface of a semiconductor body of silicon, a source region and a drain region being formed in the semiconductor body on either side of the gate electrode, a part of said source and drain regions bordering on the edge of the gate electrode, for brevity hereinafter generally referred to as LDD (=Lightly Doped Drain) region, being provided with a lower doping concentration, and on either side of the gate electrode, the surface of the semiconductor body being provided with a dielectric layer, the part of which bordering on the surface of the semiconductor body being obtained by thermal oxidation of the semiconductor body, and the more heavily doped parts of the source region and of the drain region being formed by providing a spacer on either side of the gate electrode and subsequently doping the semiconductor body with suitable doping atoms by means of an ion implantation. In practice, generally both the source region and the drain region are provided with an LDD region.

Such a method is used, in particular, in the manufacture of ICs (=Integrated Circuits) wherein MOS, CMOS or BICMOS circuits are incorporated. The MOS transistor serves, for example, as a switch but may alternatively be embodied so as to be a memory element. The LDD regions preclude, or at least limit, the development of hot charge carriers in that they limit the size of the maximum lateral electric field. The importance hereof increases steadily as the dimensions of the MOS transistors decrease continually.

A method of the type mentioned in the opening paragraph is known from United States patent specification U.S. Pat. No. 5,702,986, published on Dec. 30, 1997. The manufacture of a MOST in a silicon substrate is described by means of FIG. 1 of said patent specification, in which a more heavily doped part of the source and drain regions is formed by doping the substrate with doping atoms by means of an ion implantation after the gate electrode formed is provided with a spacer on both sides. Prior to this process step, the surface of the semiconductor body is provided, on either side of the gate electrode formed, with a dielectric layer, in this case a silicon dioxide layer, whose formation is partly due to reoxidizing the semiconductor surface after the formation of the gate electrode, and the silicon substrate is doped with doping atoms on either side of the gate electrode by means of an ion implantation at a lower implantation energy and/or implantation flux, thereby forming the LDD regions. After both implantations, a temper step takes place in which, at the location of both the more heavily and the more lightly doped parts of the source and drain regions, the crystal damage in the silicon substrate is repaired, and in which step the doping atoms are rendered electrically active.

A drawback of the known method is that the MOST manufactured thereby still suffers from the above-mentioned "short-channel" effects, which manifest themselves, inter alia, in that the threshold voltage of the MOST manufactured decreases substantially for very short lengths of the gate electrode, which is undesirable.

SUMMARY OF THE INVENTION

Therefore, it is an object of the invention to provide a method of the type mentioned in the opening paragraph, in which the above-mentioned drawback is obviated or at least substantially reduced, and which method consequently enables short-channel effects, such as a substantial dependence of the threshold voltage upon the length of the gate electrode, to be more strongly suppressed in a MOST. In addition, the method should be as simple as possible.

To achieve this, a method of the type mentioned in the opening paragraph is characterized in that the lightly doped part of the source and drain regions is obtained by doping, in a first step, the dielectric layer with suitable doping atoms by means of a second ion implantation, the implantation conditions being chosen to be such that after the second ion implantation substantially all doping atoms are situated within the dielectric layer, and, in a second step, a part of the doping atoms is diffused from the dielectric layer into the semiconductor body, resulting in the formation of the more lightly doped part of the source region and the drain region. The invention is based on a number of surprising realizations. Since the doping atoms necessary to form the LDD regions are implanted in the dielectric layer, the quantity of doping atoms available for this purpose can be adjusted very accurately and reproducibly, resulting in a very accurate and reproducible method. In addition, since the doping atoms do not (yet) find their way to the semiconductor body, crystal damage to the semiconductor body is precluded, so that an irregular and accelerated diffusion in a tempering step, which step is necessary in such a case, does not occur in a method in accordance with the invention. In a second step, a part of the doping atoms available in the dielectric layer are diffused in the semiconductor body, resulting in LDD regions having a very steep and very shallow doping profile. By virtue thereof, the MOST manufactured has excellent properties, such as a threshold voltage which is relatively independent of the length of the gate electrode. The invention is further based on the recognition that the thin dielectric layers generally present in a MOST, such as layers of silicon dioxide, silicon nitride and silicon oxynitride, constitute a very suitable diffusion source for the formation of the LDD regions. It has surprisingly been found that the method in accordance with the invention is very accurate and reproducible, provided that the first part of the dielectric layer used for the second implantation and the subsequent diffusion step consists of (thermally produced) silicon dioxide. In the second ion implantation, ions may penetrate the dielectric layer nearly as far as the surface of the semiconductor body; this even has a favorable effect on the formation of very shallow and steep LDD regions with a minimum heat supply during the diffusion step. It is important that the quantity of atoms reaching the semiconductor body during the ion implantation is so small that no, or hardly any, crystal damage occurs in the semiconductor body. However, the implanted profile may also be situated at a small distance, for example a few nanometers, from said surface. Finally, the invention is based on the recognition that the equipment necessary for ion implantation can be currently provided with the means for carrying out an ion implantation at a very low implantation energy.

In a preferred embodiment of a method in accordance with the invention, the dielectric layer is formed simultaneously with the gate oxide. In addition to excellent results obtained by using such a dielectric layer, such a method is very simple and links up well with the customary MOS technology. Preferably, the dielectric layer is formed by thickening the gate oxide on either side of the gate electrode by means of a thermal oxidation. In practice it has been found that very suitable thicknesses of the dielectric layer range between 2 and 20 nm, preferably between 2 and 10 nm. In this respect, the flux of the second ion implantation can be chosen to range between $10^{14}$ and $10^{16}$ at/cm$^{-2}$, and the implantation energy can be chosen to range between 0.1 and 5 keV.

In a first variant of the methods described hereinabove, the second ion implantation is carried out prior to the provision of the spacers, whereafter the first ion implantation is carried out. This variant is very suitable because the spacers, which can be advantageously used for a so-called silicide process, remain intact. In another variant, after the provision of the spacers and carrying out the first ion implantation, said spacers are removed, after which the second ion implantation is carried out. This enables an independent treatment of both parts of the source and drain regions to be carried out. In this variant, preferably, new spacers are subsequently provided.

In an important embodiment for the manufacture of NMOS transistors, arsenic ions are used for the first ion implantation and phosphor ions for the second ion implantation. By virtue of the use of arsenic ions, the more heavily doped parts of the source and drain regions can be formed so as to be very well defined and relatively shallow. By virtue of the use of phosphor ions, the desired diffusion from the dielectric layer can be readily carried out. In the case of PMOS transistors, use can be made of the same or different boron ions for both implantations.

Advantageously, the activation of the doping atoms introduced into the semiconductor body during the first ion implantation and the diffusion in the semiconductor body of a part of the doping atoms introduced into the dielectric layer during the second ion implantation is carried out in a single thermal treatment of the semiconductor body. In this manner, the desired result is achieved with a minimum of process steps and a minimum heat supply to the semiconductor body. The best results are achieved if the above-mentioned activation and diffusion are carried out by means of a so-called RPA (=Rapid Thermal Annealing) step. Also the diffusion and activation of the doping atoms with which, if desired, the gate electrode (generally of polycrystalline silicon) is doped, is preferably carried out in the same manner and can be advantageously carried out in the step in which also the above-mentioned activation, resulting in the formation of more heavily doped parts of source and drain regions, and diffusion, resulting in the formation of LDD regions, is carried out. The invention finally also relates to a semiconductor device comprising a MOS transistor which is obtained by means of a method in accordance with the invention.

These and other aspects of the invention are apparent from and will be elucidated with reference to the embodiments described hereinafter.

BRIEF DESCRIPTION OF THE DRAWING

In the drawings.

The Figures are not drawn to scale, and particularly the dimensions in the thickness direction are exaggerated for clarity. Like reference numerals refer to like regions, whenever possible, and regions of the same conductivity type are hatched in the same manner, whenever possible.

DESCRIPTION OF THE PREFERRED EMBODIMENT

Figure 1:
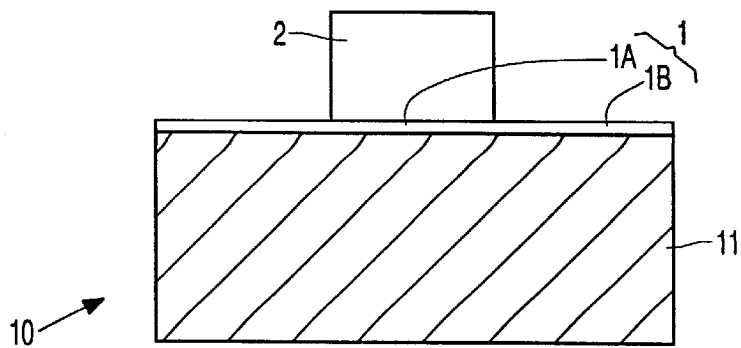
FIGS. 1 through 6 are diagrammatic, cross-sectional views, at right angles to the thickness direction, of a semiconductor device with a MOS transistor at successive stages in the manufacture, in accordance with a first embodiment of a method according to the invention.
Figure 2:
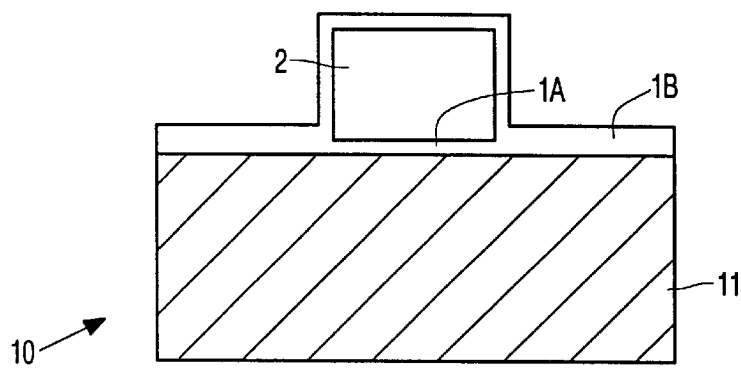
Figure 3:
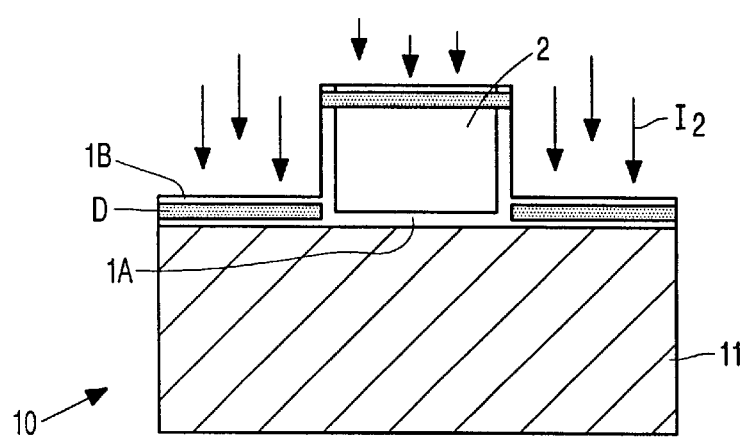
Figure 4:
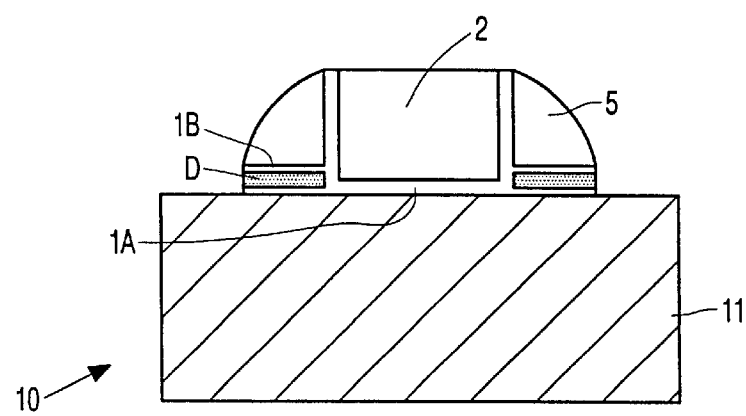
Figure 5:
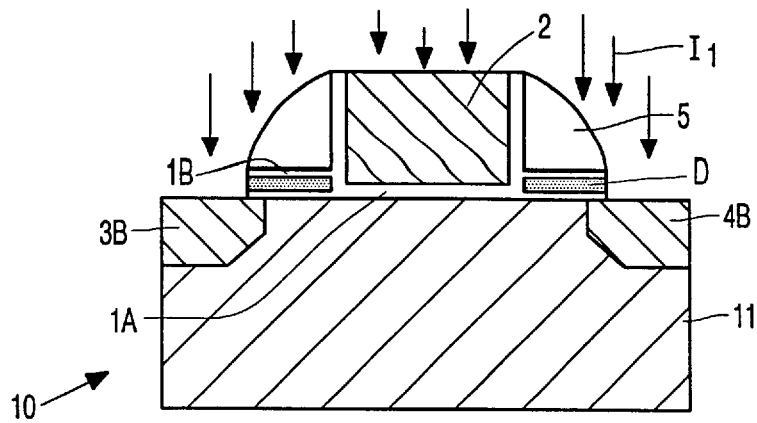
Figure 6:
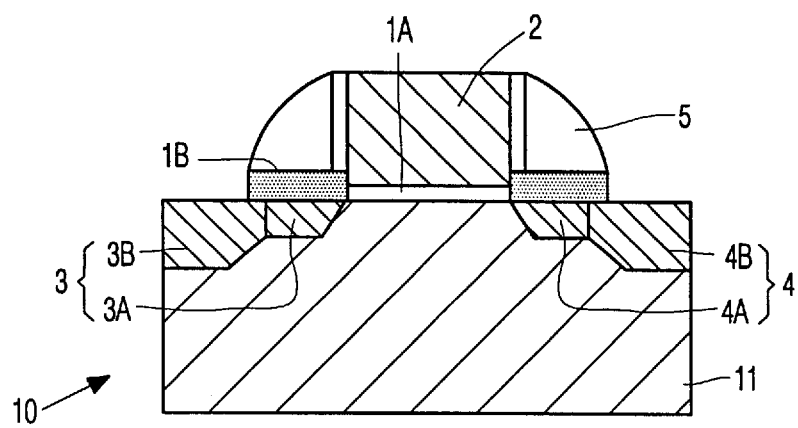
Figure 7:
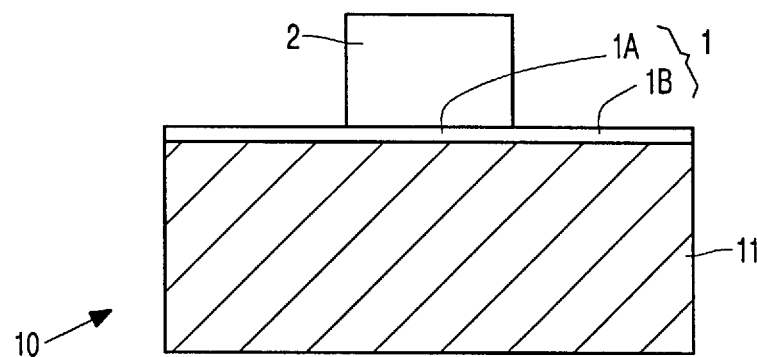
FIGS. 7 through 12 are diagrammatic, cross-sectional views, at right angles to the thickness direction, of a semiconductor device with a MOS transistor at successive stages in the manufacture, in accordance with a second embodiment of a method according to the invention.
Figure 8:
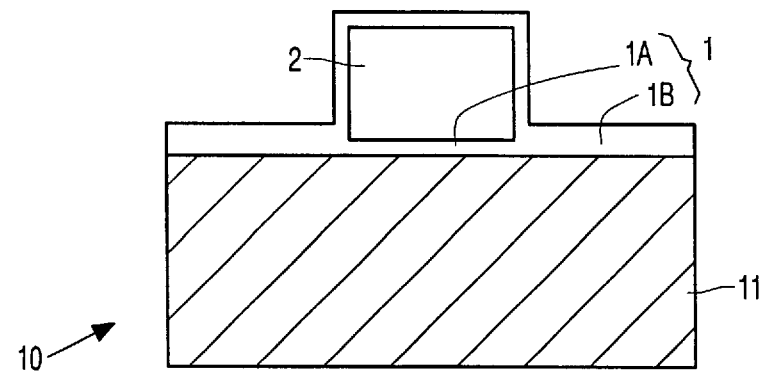
Figure 9:
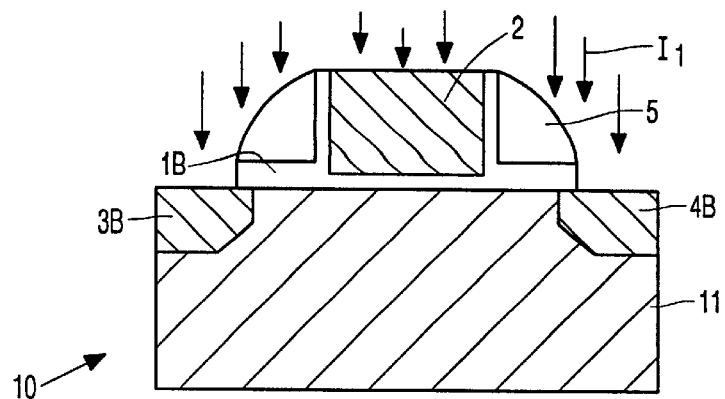
Figure 10:
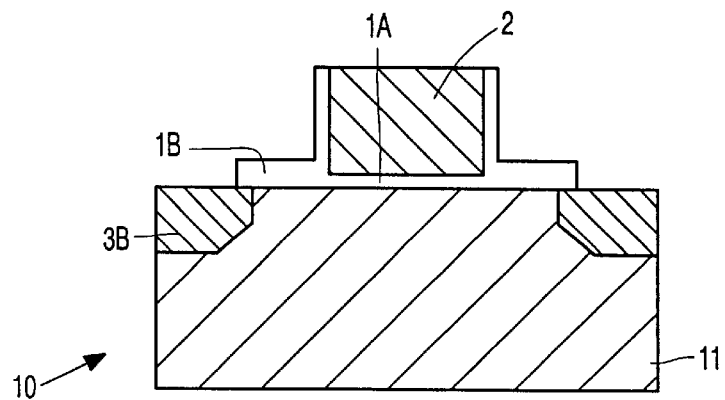
Figure 11:
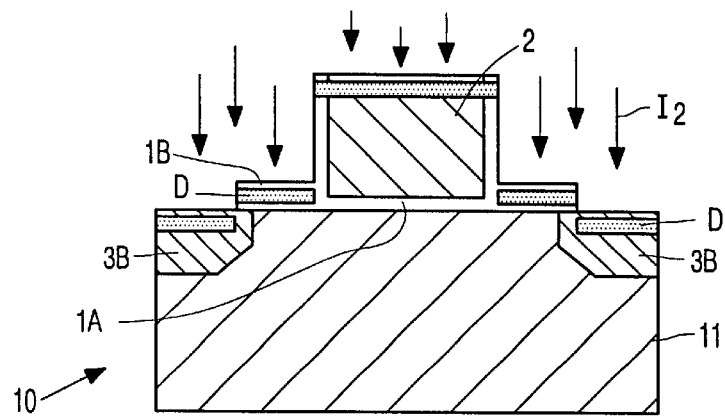

FIGS. 1 through 6 are diagrammatic, cross-sectional views, at right angles to the thickness direction, of a semiconductor device comprising a MOS transistor at successive stages in the manufacture in accordance with a first embodiment of a method according to the invention. The transistor being manufactured in this case is a NMOS transistor, whereby use is made (see FIG. 1) of a p-type silicon substrate 11 having a resistivity of approximately 10 mΩcm, which is provided with a 2μm thick (not shown) epitaxial layer of p-type silicon having a resistivity of 10 Ωcm which, in this case, also constitutes the semiconductor body 10. After a cleaning step in a mixture of ammonia, hydrogen peroxide and water, the substrate 11 is provided with an oxide layer 1 having a thickness ranging from 2 to 10 nm, here 4 nm, by means of thermal oxidation at a temperature in the range from 600 to 1100° C., in this case 1000° C., in an oxygen-containing atmosphere. An undeliberately doped layer 2 of polycrystalline silicon is deposited in a thickness from 100 to 300 nm, here 200 nm, onto said oxide layer by means of CVD at a temperature of approximately 600° C. This layer is photolithographically provided with a mask having a width from 0.05 to 0.5 μm, here 0.1 μm, and the parts thereof which are situated outside the mask are subsequently removed by means of plasma etching, thereby forming a gate electrode 2 of the MOST to be formed. The part 1A of the silicon dioxide layer 1 serves as the gate oxide 1A of the MOST to be formed. At this stage, the part 1B serves as an etch-stop layer in the formation of the gate electrode 2. Subsequently, (see FIG. 2) the thickness of the part 1B of the oxide layer 1 is increased by means of thermal oxidation to 2–20 nm, here 6 nm, resulting in the formation, on either side of the gate electrode 2, of a dielectric layer 1B which is suitable for the invention. In this process, also the side faces and the upper side of the gate electrode 2 are provided with a silicon dioxide layer whose thickness is comparable or slightly larger because the gate electrode 2 contains polycrystalline silicon.

Subsequently, (see FIG. 3), in accordance with the invention, an ion implantation $I_2$, in this case of phosphor ions, is carried out with a flux, here $10_{15}$ at/cm$^3$, and an energy, here 1 keV, such that the resulting profile of phosphor atoms (D) is situated substantially entirely within the dielectric layer 1B. Next, (see FIG. 4), the entire surface of the semiconductor body 10 is provided with a, in this case 100 nm thick, silicon nitride layer 5 by means of CVD at a temperature of approximately 800° C. The silicon nitride layer 5 is subsequently etched back by means of anisotropic plasma etching, in which process spacers 5 of silicon nitride situated on either side of the gate electrode 2 remain intact. Also the parts of the dielectric layer 1B which are situated outside the spacers 5 are removed in this process, as is the silicon dioxide layer situated on top of the gate electrode 2. Subsequently, (see FIG. 5) another ion $I_1$ process, in this case using arsenic ions, is carried out, in which process the deeper and more heavily doped parts 3B, 4B of the source and drain regions 3, 4 of the NMOS transistor to be formed are made. The spacers 5, the gate electrode 2 and a photoresist layer, not shown in the drawing, are used as a mask in this process. In this example, the flux and energy in this implantation process $I_1$ are, respectively, $3*10^{15}$ at/cm$^2$ and 30 keV. In the implantation process $I_1$ of this example, also the gate electrode 2 is provided with arsenic atoms. By virtue thereof, the gate electrode 2 obtains a suitable low resistance value in the range from 20 to 100 Ωsquare, here 40 Ωsquare, after an activation step in which the implanted ions/atoms are rendered electrically active.

Finally, (see FIG. 5) in accordance with the invention, the doping atoms D, i.e. here the phosphor atoms D, which are implanted in the dielectric layer 1B, are diffused from the, at this stage, remaining parts 1B of the dielectric layer 1B into the semiconductor body 10, thereby forming more lightly doped (and less deep) parts 3A, 4A of the source and drain regions. In this case, this takes place by means of a thermal treatment in the form of a so-called rapid thermal annealing step. This step is carried out by means of a halide light source, the temperature of the semiconductor body 10 reaching a temperature of 1050° C. for a short period of time, here 20 seconds. In this diffusion step LDD regions 3A, 4A are formed which are very shallow and steep. This can be attributed, on the one hand, to the absence of diffusion-accelerating crystal damage in the semiconductor body 10 at the location of the LDD regions 3A, 4A. And, on the other hand, to the fact that the thin dielectric layer 1B constitutes an excellent source for the diffusion process. By virtue thereof, and as a result of the fact that the quantity of available doping atoms D present in the dielectric layer 1B can be set very accurately and reproducibly, also the LDD regions 3A, 4A can be formed very accurately and reproducibly. This can be attributed to a substantial degree to the fact that the part of the dielectric layer 1B bordering on the surface of the semiconductor body 10 is formed by thermal oxidation. A further important advantage of the method in accordance with the invention, and of this example, is that it is simple and that it can be readily combined with customary processes.

In the above-mentioned rapid thermal annealing step, also the doping atoms in the more heavily doped parts 3B, 4B of the source and drain regions 3, 4 are electrically activated, in this example, and the crystal damage caused during the relevant ion implantation $I_1$ is repaired at the locations 3B, 4B in the semiconductor body 10. Furthermore, also the ions/atoms with which the gate electrode 2 is doped during the implantation $I_1$ are spread over the entire gate electrode 2 and electrically activated during this temperature treatment. As a result, the method of this example includes relatively few steps, which constitutes an important advantage.

Figure 12:
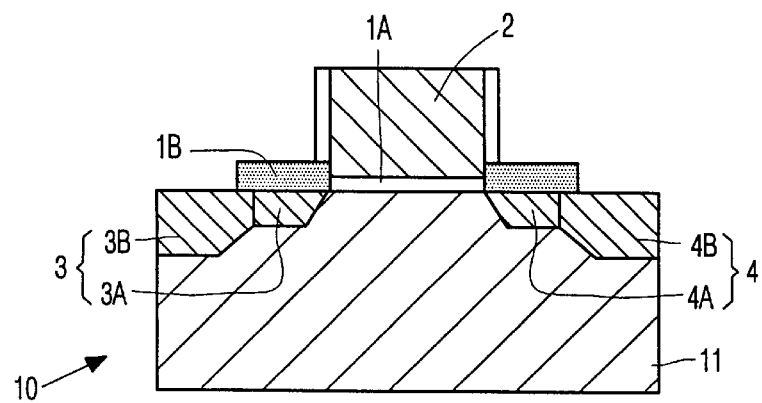

At this stage, the NMOST manufactured in accordance with the inventive method and this example, is almost ready. The remaining steps, such as providing the source and drain regions 3, 4 and the gate electrode 2 with a suitable connection conductor are not shown in the drawing and are carried out in a customary manner. In this case, the width of the source and drain regions 3, 4 is 0.13 μm, and the dimension of the MOST in a direction at right angles to the plane of the drawing amounts to several tenths of one micrometer. In this example, the finished NMOST still comprises the spacers 5. Such a transistor has the advantage that its source and drain regions 3, 4, and if necessary also the gate electrode 2, can be provided with a silicide layer (for example cobalt silicide or titanium silicide) in a self-aligning manner, for example a so-called silicide process. Next, a description will be given of a second example of a method in accordance with the invention, in which the sequence of the two ion implantations $I_1$, $I_2$ used is changed. FIGS. 7 through 11 are diagrammatic, cross-sectional views, at right angles to the thickness direction, of a semiconductor device comprising a MOS transistor, at successive stages in the manufacture in accordance with a second embodiment of a method according to the invention. For the first steps (see FIGS. 7 and 8) reference is made to the previous example since these steps are the same in this example and in the previous example. In this example, subsequently (see FIG. 9) the spacers 5 of silicon nitride are provided, whereafter the first ion implantation $I_1$, in this case using arsenic ions, is carried out, thereby forming the more heavily doped (and deeper) regions 3B, 4B of the source and drain regions 3, 4. Next, (see FIG. 10) the spacers 5 are removed again by means of selective etching. For this purpose use is made of phosphoric acid of approximately 80° C. Subsequently, the second ion implantation $I_2$ is carried out, in this case using phosphor ions, thereby providing the dielectric layer 1B with doping atoms D. In this case, unlike the previous example, the more heavily doped parts 3B, 4B are provided in this implantation $I_2$ with an additional dose of n-type doping atoms. In this example, the implantation conditions for both implantations $I_1$, $I_2$ are the same as in the previous example. The same applies (see FIG. 12) to the final step in the manufacture described in this example, the conditions being the same as in the previous example. This also applies to the as yet absent contacting/electrical connection of the transistor and to the dimensions of the transistor and the components thereof.

The variant discussed in this example, in which the spacers 5 are only temporarily present, has the advantage that tempering of the first ion implantation $I_1$ can be carried out before the doping atoms D necessary to form the LDD regions 3A, 4A are present in the semiconductor body. This means that, if necessary, this temper step can be carried out at a temperature which is higher than the temperature at which the diffusions step takes place, which, dependent upon the conditions in which both steps are carried out, is an important advantage. In that case, the diffusion step can be carried out independently of the first implantation $I_1$. With a view to a self-recording provision of a possible silicide layer on source 3, drain 4 and gate electrode 2, it is possible in the method of this example to again provide, if necessary, spacers on either side of the gate electrode 2 after the second implantation $I_2$. In addition, also a MOST manufactured by means of this inventive method leads to very favorable properties of the transistor manufactured with said MOST. This becomes manifest, inter alia, if an important property of a transistor manufactured by the method of the second example is compared to that of a transistor manufactured by means of a conventional method. This will be explained with reference to FIG. 13.

Figure 13:
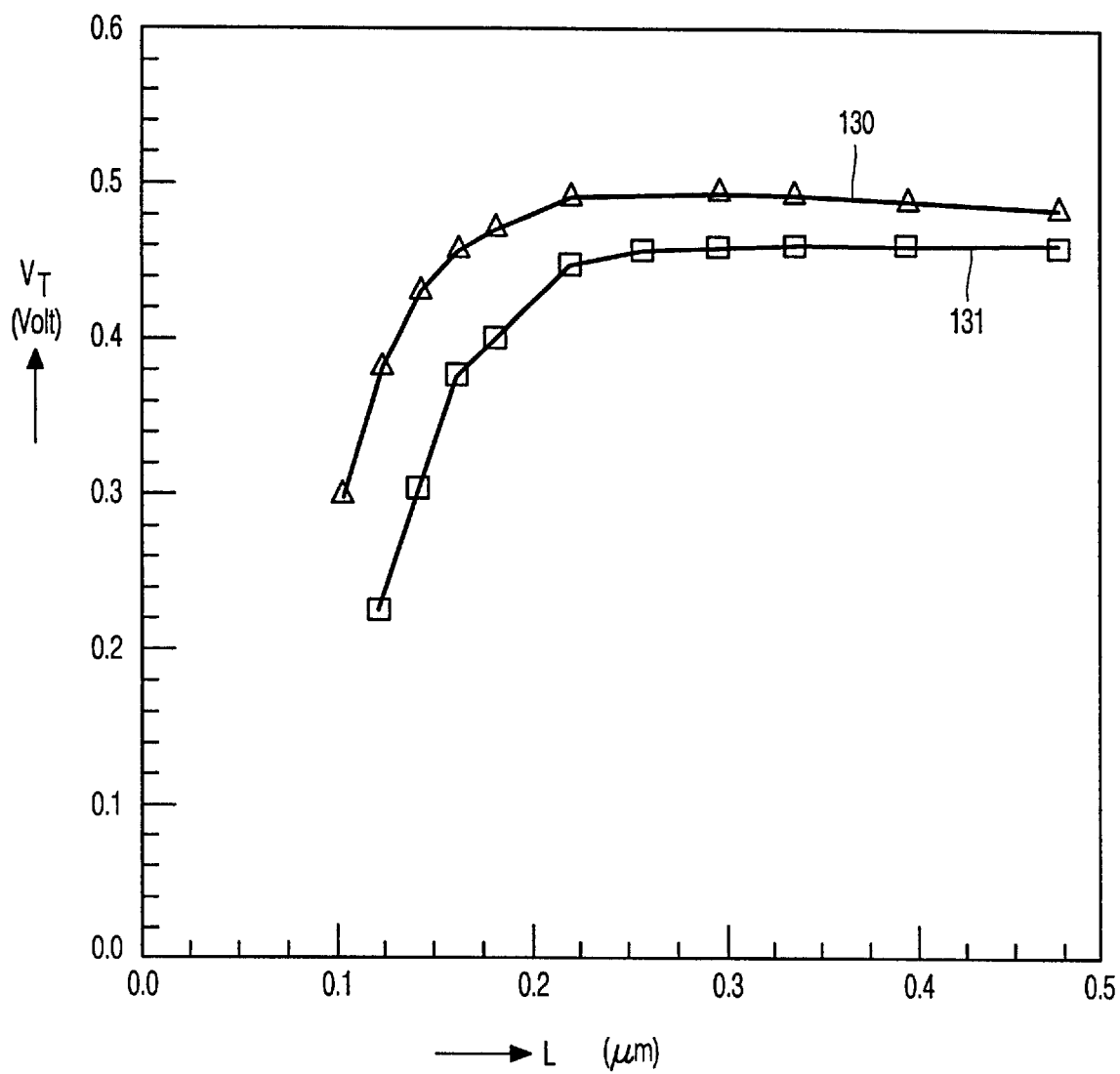
FIG. 13 shows the threshold voltage ($V_T$) as a function of the length of the gate electrode (L) of a MOS transistor which is manufactured by means of a method in accordance with the invention and which corresponds to the second embodiment (curve 130), and the threshold voltage (VT) as a function of the length of the gate electrode (L) of a comparable MOS transistor which is manufactured in a conventional manner (curve 131).

FIG. 13 shows the threshold voltage (VT) as a function of the length of the gate electrode (L) of a MOS transistor which is manufactured by means of a method in accordance with the invention and which corresponds to the second embodiment (curve 130), and the threshold voltage ($V_T$) as a function of the length of the gate electrode (L) of a comparable MOS transistor which is manufactured in a conventional manner (curve 131). In the latter case, both the more heavily doped parts 3B, 4B and the more lightly doped parts 4A, 4B of the source and drain regions 3, 4 are manufactured by means of ion implantation, the silicon semiconductor body being directly doped with the doping atoms. FIG. 13 shows that in a transistor manufactured by means of a method in accordance with the invention, the threshold voltage is less dependent upon the length of the gate electrode 2, particularly for very small lengths of the gate electrode 2, than in the case of a conventionally manufactured transistor. This is an important advantage. In the majority of ICs, use is made of MODS transistors having different lengths for the gate electrode 2. In spite thereof, all transistors still have (substantially) the same threshold voltage, which can be attributed to the method in accordance with the invention, and which leads to a substantial simplification of the use of the transistors. In addition, a transistor manufactured by means of a method in accordance with the invention may have very small dimensions, so that the method can very suitably be used to manufacture ICs having a very high component density.

The invention is not limited to the examples given herein, and within the scope of the invention many variations and modifications are possible to those skilled in the art. For example different thicknesses, different (semiconductor) materials or different compositions may be used. It is also possible to replace the conductivity types used by the opposite conductivity types.

Various process steps which are not relevant to the invention may also be carried out in a different manner, for example, instead of a plasma-etch step, a wet-chemical etch step may be used, and conversely. Furthermore, in practice the geometry of a MOS transistor is often different from the (simple) rectangular geometry described in the examples.

Finally, it is noted that the method is not limited to a discrete transistor, such as in particular transistors for RF (=Radio Frequency) applications, and that the method is excellently suited for MOS ICs, as manufactured in NMOS, PMOS, CMOS, BIMOS and BICMOS processes. If the gate electrode is embodied so as to be a floating gate electrode, it can also be used in memory ICs.

What is claimed is:

1. A method of manufacturing a semiconductor device comprising a MOS transistor comprising:

forming a gate oxide (1A) and a gate electrode (2) on a surface of a semiconductor body (10) of silicon, forming a source region (3) and a drain region (4) in the semiconductor body (10) on either side of the gate electrode (2), providing, on either side of the gate electrode (2), the surface of the semiconductor body (10) with a dielectric layer (1B), obtaining the part of which bordering on the surface of the semiconductor body (10) by thermal oxidation of the semiconductor body (10), implanting first ions ($I_2$) into the dielectric layer (1B), providing a spacer (5) on either side of the gate electrode (2), removing the parts of the dielectric layer (1B) which are situated outside the spacer (5), subsequently doping the semiconductor body (10) with doping atoms by implanting second ions ($I_1$) in the semiconductor body to form a more heavily doped part (3B, 4B) of the source and drain regions (3, 4), and obtaining a more lightly doped part (3A, 4A) of the source and drain regions (3, 4) by diffusing a part of the doping atoms (D) from the dielectric layer (1B) situated beneath the spacer (5) into the semiconductor body (10).

2. A method as claimed in claim 1, comprising forming the dielectric layer (1B) simultaneously with the gate oxide (1A).

3. A method as claimed in claim 2, comprising forming the dielectric layer (1B) by thickening the gate oxide (1A) on either side of the gate electrode (2) by thermal oxidation.

4. A method as claimed in claim 1, comprising choosing the thickness of the dielectric layer (1B) to range between 2 and 20 nm.

5. A method as claimed in claim 1, comprising choosing a flux of the first ion implantation ($I_2$) to range between $10^{14}$ and $10^{16}$ at/cm$^{-2}$, and an implantation energy is chosen to range between 0.1 and 5 keV.

6. A method as claimed in claim 1, comprising manufacturing an NMOS transistor characterized in that arsenic ions are used for implanting the second ions ($I_1$) and phosphor ions for implanting the first ions ($I_2$).

7. A method as claimed in claim 1, comprising carrying out an activation of the doping atoms introduced into the semiconductor body (10) during implanting the second ions ($I_1$) and the diffusion in the semiconductor body (10) of a part of the doping atoms (D) introduced into the dielectric layer (1B) during implanting the first ions ($I_2$) in a single thermal treatment of the semiconductor body (10).

8. A method as claimed in claim 1, comprising choosing the thickness of the dielectric layer (1B) to range between 2 and 10 nm.

9. A method as claimed in claim 1, comprising carrying out an activation of the doping atoms introduced into the semiconductor body (10) during implanting the second ions ($I_1$) and the diffusion in the semiconductor body (10) of a part of the doping atoms (D) introduced into the dielectric layer (1B) during implanting the first ions ($I_2$) in a single rapid thermal annealing treatment of the semiconductor body (10).

* * * * *